United States Patent
Žuvela et al.

(10) Patent No.: US 12,259,338 B2
(45) Date of Patent: Mar. 25, 2025

(54) MITIGATION OF UNDESIRED SPECTRAL EFFECTS IN OPTICAL METROLOGY

(71) Applicant: Onto Innovation Inc., Wilmington, MA (US)

(72) Inventors: Petar Žuvela, Singapore (SG); Jingsheng Shi, Singapore (SG); Wei Ming Chiew, Singapore (SG); Jie Li, San Jose, CA (US)

(73) Assignee: Onto Innovation Inc., Wilmington, MA (US)

( * ) Notice: Subject to any disclaimer, the term of this patent is extended or adjusted under 35 U.S.C. 154(b) by 88 days.

(21) Appl. No.: 17/860,978

(22) Filed: Jul. 8, 2022

(65) Prior Publication Data

US 2024/0011921 A1    Jan. 11, 2024

(51) Int. Cl.
  *G01N 21/31*     (2006.01)
  *G01N 21/95*     (2006.01)

(52) U.S. Cl.
  CPC ......... *G01N 21/9501* (2013.01); *G01N 21/31* (2013.01)

(58) Field of Classification Search
  CPC .......... G01N 21/9501; G01N 2021/213; G06T 2207/30148
  See application file for complete search history.

(56) References Cited

U.S. PATENT DOCUMENTS

| | | | |
|---|---|---|---|
| 6,853,923 B2 | 2/2005 | Trygg et al. | |
| 10,534,257 B2 | 1/2020 | Tetiker et al. | |
| 2003/0200040 A1 | 10/2003 | Trygg et al. | |
| 2007/0038041 A1 | 2/2007 | Yang et al. | |
| 2019/0311083 A1 | 10/2019 | Feng et al. | |
| 2020/0393240 A1 | 12/2020 | Marcus et al. | |

(Continued)

FOREIGN PATENT DOCUMENTS

| | | |
|---|---|---|
| CN | 109642875 A | 4/2019 |
| CN | 111595812 A | 8/2020 |

(Continued)

OTHER PUBLICATIONS

Dunn, Kevin, "Process Improvement Using Data: 6.7.1 Advantages of the projection to latent structures (PLS) method," https://learnche.org/pid/latent-variable-modelling/projection-to-latent-structures/advantages-of-projection-to-latent-structures, Apr. 6, 2022.

*Primary Examiner* — Maurice C Smith
(74) *Attorney, Agent, or Firm* — Paradice & Li LLP

(57) ABSTRACT

Optical measurement of a sample that includes a structure-of-interest (SOI) optically coupled to an unknown structure is optically measured by extracting from the resulting spectral signal the spectral variation that is correlated to key parameters associated with the SOI and removing the spectral variation from unknown structure that is irrelevant to the key parameters. An offline process is used to generate a physics-based model from a number of calibration measurements using reconstructed spectral signals after removing the spectral variation from the spectral signals that is irrelevant to the key parameters. A machine learning model may be additionally generated using at least the spectral variations correlated to key parameters associated with the SOI. In an in-line process, a sample is measured by filtering the spectral signals from a sample to remove spectral effects from the unknown structure and using the physics-based model or using the trained machine learning model.

40 Claims, 8 Drawing Sheets

(56) References Cited

U.S. PATENT DOCUMENTS

| | | |
|---|---|---|
| 2021/0175104 A1 | 6/2021 | Banna et al. |
| 2022/0120555 A1 | 4/2022 | Yamada et al. |
| 2023/0213870 A1 | 7/2023 | Li et al. |

FOREIGN PATENT DOCUMENTS

| | | |
|---|---|---|
| JP | 2012143348 A | 8/2012 |
| KR | 20070122565 A | 12/2007 |
| TW | 201243738 A | 11/2012 |
| TW | 202127005 A | 7/2021 |

MITIGATION OF UNDESIRED SPECTRAL EFFECTS IN OPTICAL METROLOGY

FIELD OF THE DISCLOSURE

Embodiments of the subject matter described herein are related generally to optical metrology, and more particularly to modeling and measuring structures that include unknown sections.

BACKGROUND

Semiconductor and other similar industries often use optical metrology equipment to provide non-contact evaluation of samples during processing. With optical metrology, a sample under test is illuminated with light, e.g., at a single wavelength or multiple wavelengths. After interacting with the sample, the resulting light is detected and analyzed to determine one or more characteristics of the sample.

The analysis typically includes a model of the structure under test. The model may be generated based on the materials and the nominal parameters of the structure, e.g., film thicknesses, line and space widths, etc. One or more parameters of the model may be varied and the predicted data may be calculated for each parameter variation based on the model, e.g., using Rigorous Coupled Wave Analysis (RCWA) or other similar techniques. The measured data may be compared to the predicted data for each parameter variation, e.g., in a nonlinear regression process, until a good fit is achieved between the predicted data and the measured data, at which time the fitted parameters are determined to be an accurate representation of the parameters of the structure under test.

Modeling techniques are particularly useful when the sample has periodic structure. Unfortunately, when the sample includes sections that are non-periodic, analytically modeling the sample can be difficult. Moreover, if the sample includes one or more sections with unknown design and/or characteristics, i.e., preliminary structural information for one or more sections is unknown or unavailable, building a rigorous model for the sample is not possible. Therefore, what is needed is an improved optical metrology process that can be used to measure sample structures that include unknown and/or non-periodic sections.

SUMMARY

Optical measurement of a sample that includes a structure-of-interest (SOI) optically coupled to an unknown structure is optically measured by removing the spectral effects due to the unknown structure from a spectral signal, which can then be used in a modeling process or machine learning process to determine one or more parameters of the sample. The spectral effects due to the unknown structure may be removed by extracting the spectral variation that is correlated to key parameters associated with the SOI and removing the spectral variation that is irrelevant to the key parameters. A reconstructed spectral variation may then be generated without the spectral effects that are due to the unknown structure. A model of the sample, including a rigorous model for the SOI and an effective model for the unknown structure, may be produced using the reconstructed spectral variation. In a machine learning implementation, a machine learning model may be trained, e.g., based on at least the spectral variations correlated to key parameters associated with the SOI. During measurement, the spectral signal from a sample may be filtered to remove the spectral effects from the unknown structure. One or more parameters are determined either by using the model of the sample, or by the trained machine learning model using the spectral signals.

In one implementation, a method for optical measurement of a sample includes obtaining optical metrology data from a plurality of measurement sites on one or more samples, wherein each measurement site comprises a structure-of-interest (SOI) having a set of known parameters and an unknown structure that has unknown parameters, wherein the optical metrology data comprises spectral signals. The method includes extracting spectral variations correlated with key parameters associated with the SOI from the spectral signals. Reconstructed spectral signals are generated based on the spectral variations correlated with the key parameters associated with the SOI. The method further includes generating a physics based model for optical measurement of the SOI based on the reconstructed spectral signals.

In one implementation, an optical metrology device configured for optical measurement of a sample includes a light source configured to generate light to be incident on measurement sites on samples, each measurement site comprising a structure-of-interest (SOI) having a set of known parameters and an unknown structure that has unknown parameters. The optical metrology device further includes a detector configured to detect light from the target structure produced in response to the light that is incident on the target structure and at least one processor coupled to the detector. The at least one processor is configured to obtain optical metrology data from a plurality of measurement sites on one or more samples, wherein the optical metrology data comprises spectral signals. The at least one processor is further configured to extract spectral variations correlated with key parameters associated with the SOI from the spectral signals. Reconstructed spectral signals are generated based on the spectral variations correlated with the key parameters associated with the SOI. The at least one processor is further configured to generate a physics-based model for optical measurement of the SOI based on the reconstructed spectral signals.

In one implementation, an optical metrology device configured for optical measurement of a sample includes a light source configured to generate light to be incident on a measurement site on samples, each measurement site comprising a structure-of-interest (SOI) having a set of known parameters and an unknown structure that has unknown parameters. The optical metrology device further includes a detector configured to detect light from the target structure produced in response to the light that is incident on the target structure. The optical metrology device includes a means for obtaining optical metrology data from a plurality of measurement sites on one or more samples, wherein each measurement site comprises a structure-of-interest (SOI) having a set of known parameters and an unknown structure that has unknown parameters, wherein the optical metrology data comprises spectral signals. The optical metrology device further includes a means for extracting spectral variations correlated with key parameters associated with the SOI from the spectral signals. The optical metrology device includes a means for reconstructing spectral signals based on the spectral variations correlated with the key parameters associated with the SOI; The optical metrology device further includes a means for generating a physics-based model for optical measurement of the SOI based on the reconstructed spectral signals.

In one implementation, a method for optical measurement of a sample includes obtaining optical metrology data from a measurement site on a sample, the measurement site comprises a structure-of-interest (SOI) having a set of known parameters and an unknown structure that has unknown parameters, wherein the optical metrology data comprises a spectral signal. The method includes generating a filtered spectral signal to remove spectral effects from the unknown structure that has unknown parameters. The method further includes determining one or more parameters of the SOI using the filtered spectral signal and a model for the measurement site, wherein the model comprises a rigorous model that represents the SOI and an effective model that represents the unknown structure.

In one implementation, an optical metrology device configured for optical measurement of a sample includes a light source configured to generate light to be incident on a measurement site of a sample, the measurement site comprising a structure-of-interest (SOI) having a set of known parameters and an unknown structure that has unknown parameters. The optical metrology device further includes a detector configured to detect light from the target structure produced in response to the light that is incident on the target structure and at least one processor coupled to the detector. The at least one processor is configured to obtain optical metrology data from a measurement site on a sample, the measurement site comprises a structure-of-interest (SOI) having a set of known parameters and an unknown structure that has unknown parameters, wherein the optical metrology data comprises a spectral signal. The at least one processor is further configured to generate a filtered spectral signal to remove spectral effects from the unknown structure that has unknown parameters. The at least one processor is further configured to determine one or more parameters of the SOI using the filtered spectral signal and a model for the measurement site, wherein the model comprises a rigorous model that represents the SOI and an effective model that represents the unknown structure.

In one implementation, an optical metrology device configured for optical measurement of a sample includes a light source configured to generate light to be incident on a measurement site on a sample, the measurement site comprising a structure-of-interest (SOI) having a set of known parameters and an unknown structure that has unknown parameters. The optical metrology device further includes a detector configured to detect light from the target structure produced in response to the light that is incident on the target structure and at least one processor coupled to the detector. The optical metrology device further includes means for obtaining optical metrology data from a measurement site on a sample, the measurement site comprises a structure-of-interest (SOI) having a set of known parameters and an unknown structure that has unknown parameters, wherein the optical metrology data comprises a spectral signal. The optical metrology device further includes means for generating a filtered spectral signal to remove spectral effects from the unknown structure that has unknown parameters. The optical metrology device further includes means for determining one or more parameters of the SOI using the filtered spectral signal and a model for the measurement site, wherein the model comprises a rigorous model that represents the SOI and an effective model that represents the unknown structure.

In one implementation, a method for optical measurement of a sample includes obtaining optical metrology data from a measurement site on a sample, the measurement site comprises a structure-of-interest (SOI) having a set of known parameters and an unknown structure that has unknown parameters, wherein the optical metrology data comprises a spectral signal. The method further includes determining one or more parameters of the SOI using the spectral signal and a machine learning recipe for the measurement site.

In one implementation, an optical metrology device configured for optical measurement of a sample includes a light source configured to generate light to be incident on a measurement site on a sample, the measurement site comprising a structure-of-interest (SOI) having a set of known parameters and an unknown structure that has unknown parameters. The optical metrology device further includes a detector configured to detect light from the target structure produced in response to the light that is incident on the target structure and at least one processor coupled to the detector and at least one processor coupled to the detector. The at least one processor is configured to obtain optical metrology data from a measurement site on a sample, the measurement site comprises a structure-of-interest (SOI) having a set of known parameters and an unknown structure that has unknown parameters, wherein the optical metrology data comprises a spectral signal. The at least one processor is further configured to determine one or more parameters of the SOI using the spectral signal and a machine learning recipe for the measurement site.

In one implementation, an optical metrology device configured for optical measurement of a sample includes a light source configured to generate light to be incident on a measurement site on a sample, the measurement site comprising a structure-of-interest (SOI) having a set of known parameters and an unknown structure that has unknown parameters. The optical metrology device further includes a detector configured to detect light from the target structure produced in response to the light that is incident on the target structure and at least one processor coupled to the detector. The optical metrology device further includes means for obtaining optical metrology data from a measurement site on a sample, the measurement site comprises a structure-of-interest (SOI) having a set of known parameters and an unknown structure that has unknown parameters, wherein the optical metrology data comprises a spectral signal. The optical metrology device further includes means for determining one or more parameters of the SOI using the spectral signal and a machine learning recipe for the measurement site.

DETAILED DESCRIPTION

Figure 1:
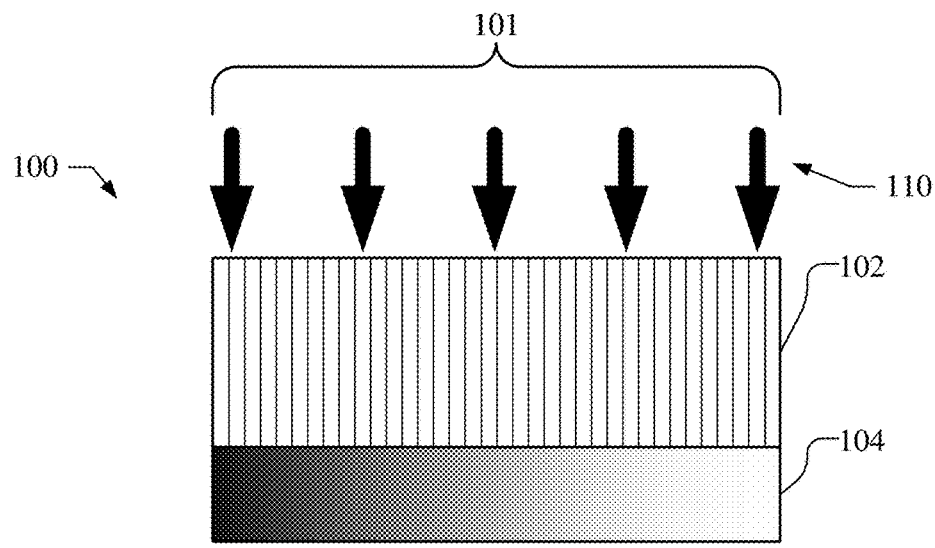
FIG. 1 illustrates a side view of one example of a region-of-interest (ROI) of a sample that includes an SOI that has a known structure with little or no variation across the ROI and a section having an unknown structure that varies across the ROI.

During fabrication of semiconductor and similar devices it is very often necessary to monitor the fabrication process by non-destructively measuring the devices. Optical metrology may be employed for non-contact evaluation of samples during processing. Optical metrology techniques, such as thin film metrology and Optical Critical Dimension (OCD) metrology, may use modeling of the structure to generate predicted data that is to be compared with the measured data from the sample. Variable parameters in the model, such as layer thicknesses, line widths, space widths, sidewall angles, material properties, etc., may be adjusted varied and the predicted data is generated for each variation. The measured data may be compared with the predicted data for each parameter variation, e.g., in a nonlinear regression process, until a good fit is achieved, at which time the values of the fitted parameters are determined to be an accurate representation of the parameters of the sample.

Conventionally, modeling requires that preliminary structural and material information is known about the sample in order to generate an accurate representative model of the sample, which may include one or more variable parameters. For example, the preliminary structural and material information for a sample may include the type of structure and a physical description of the sample with nominal values for various parameters, such as layer thicknesses, line widths, space widths, sidewall angles, etc., along with a range within which these parameters may vary. The sample may further include one or parameters that are not variable, i.e., are not expected to change in a significant amount during manufacturing. If the structure and/or materials of the structure is unknown, i.e., the preliminary structural and material information is unknown or unavailable, an accurate model cannot be generated for the structure.

Additionally, modeling using physics-based techniques such as Rigorous Coupled Wave Analysis (RCWA) requires that the modeled structure is periodic. The use of RCWA in a modeling engine is desirable because it is fast and efficient, but is accompanied with the requirement that the structure is periodic. Accordingly, modeling techniques that require periodicity, such as RCWA, are conventionally unsuitable for non-periodic structures. Other modeling techniques that do not require periodicity, such as Finite-Difference Time-Domain (FDTD) or Finite Element Method (FEM), may be used with aperiodic structures, but these techniques require detailed knowledge of the structure to generate a rigorous modeling of the entire structure, as well as nanometer-level positioning during measurement to ensure that the measured area matches the modeled area.

Accordingly, if a sample includes nuisance features, e.g., features for which the structural (or material) information is unknown and/or if the structure is non-periodic, conventional optical metrology using modeling may not be possible. By way of example, a sample may include a structure-of-interest (SOI), which can be modeled, that is optically coupled to a section of the sample with an unknown structure, e.g., preliminary structural and material information is unknown or unavailable, which may sometimes be referred to herein as the "unknown structure" or "nuisance feature." The unknown structure may be periodic, but in some cases may be non-periodic. The SOI, for example, may be on the upper layer(s) of the sample, while the unknown structure may be on lower layer(s) which underlie the SOI. In other examples, the unknown structure may be above the SOI or to the side of the SOI, or may be combined with the SOI, e.g., on the same layer and intermixed with the SOI. During optical measurement of the sample, light that is returned from the unknown structure may be coupled to light that is returned from the SOI in a complicated manner that may be difficult to decouple. Moreover, the unknown structure cannot be rigorously modeled due, e.g., to its unknown structure and possibly its non-periodicity, and accordingly, a rigorous model for the combined SOI and unknown structure cannot be built. Consequently, the use of conventional optical metrology techniques for such a sample is challenging because the predicted data for the sample cannot be generated from a rigorous model to fit to the measured data.

As discussed herein, spectral processing or feature extraction is used to eliminate or reduce undesired spectral effects from an unknown structure that is optically coupled to a SOI, e.g., using Partial Least Squares (PLS) or a variant thereof, such as Orthogonal PLS and PLS Canonical, or other similar techniques such as Principal Component Analysis (PCA), Independent Component Analysis (ICA), or a non-linear analysis, or combination of multiple analysis to improve the effectiveness of optical metrology of a sample. The process, for example, removes or reduces the undesired spectral variations due to the unknown structure and reconstructs the spectral signal, which may be used as inputs for a model analysis, or may be applied in a pure machine learning solution. The model analysis may be for physics based model, including an OCD model, a time-resolved acoustic model, X-ray model, etc. The process may be used with both model-less (e.g., measurement of CD/THK, Asymmetry—Tilt/Overlay/Shift) using a pure machine learning solution and model-based OCD metrology. For example, the process may improve ease-of-use and throughput with a machine learning solution by providing the capability to train multiple targets, and down-weights confounding variance between spectra and reference, with a single machine learning model that are compact and robust.

The process, for example, may be used to measure samples with an unknown structure that produces under-layer effects, such as with a Vertical NAND (V-NAND) or Dynamic Random-Access Memory (DRAM) structures and an underlaying (or overlaying) circuit with an unknown structure, such as a complementary metal-oxide-semiconductor (CMOS) circuit, which is sometimes referred to as CMOS-under-Array (CuA), Periphery-Under-Cell (PUC), or Cell-On-Periphery (COP). The process, for example, may be used to measure samples with a pre-layer structure, such as logic such as gate all around (GAA) or DRAM, that may be modeled by OCD model, but pre-layer parameters have spectral response that are difficult to de-couple from key parameters of current layers of the SOI. The process may enable or improve optical metrology solutions for samples with under layer effects and may be used to decorrelate key and non-key parameters from the same layer or previous process steps in any other devices.

In some implementations, for example, the process may be used to effectively extract spectral variation in the spectral signal (X) that is correlated with key-parameters (Y), which are the parameters of interest, such as CD, film thickness, etc., and remove the variation in the spectral signal (X) that is irrelevant to make predictions on the key-parameters (Y). The process may be used to filter out undesired spectral effect and reconstruct the spectral signal that are used as inputs for model creation. This results in enabling modeling for structures with unknown and/or non-periodic structures that are optically coupled to the SOI or to extend usable wavelengths in modeling with improved sensitivity and reduced correlation, thereby improving overall metrology performance. The process may be used for development of pure machine learning metrology solutions, with benefits of improved recipe robustness and stability from decoupling spectral contribution of key parameters from non-key parameters.

FIG. 1 illustrates a side view of one example of a region-of-interest (ROI) 101 of a sample 100 that includes an SOI 102 that has a known structure and a section having an unknown structure, sometimes referred to as unknown structure 104. FIG. 1 illustrates the SOI 102 as overlying the unknown structure 104, but in some implementations, the unknown structure 104 may overlie the SOI 102 or may be to the side of the SOI 102 (e.g., on the same layer(s)) or may be combined or intermixed with the SOI 102.

The SOI 102 has a known structure, i.e., nominal structural and material information for the SOI 102 is available. Accordingly, the SOI 102 may be rigorously modeled using RCWA (for a periodic structure) or using FDTD or FEM (for a non-periodic structure). The unknown structure 104, on the other hand, has an unknown structure, i.e., preliminary structural and material information is unknown or unavailable. The unknown structure 104 may be non-periodic over the ROI 101. Moreover, as illustrated with the variation in shading of the unknown structure 104, the unknown structure 104 may vary within the ROI 101. Consequently, as discussed above, rigorous modeling of the unknown structure 104 is impossible.

By way of example, in some implementations, the SOI 102 may be repetitive structures such as V-NAND or DRAM structures and the unknown structure 104 may be a circuit, such as a CMOS circuit, or some other underlaying (overlying) circuit, sometimes referred to as CuA, PUC, or COP. The preliminary structural and material information for the unknown structure 104 is unknown or unavailable and the unknown structure 104 may include non-periodic structures rendering OCD modeling of the unknown structure 104 impossible.

The unknown structure 104, alternatively, may be structures containing complex regions that were produced in earlier fabrication process steps, while the SOI 102 is in current fabrication process step. For example, a pre-layer structure (e.g., logic such as GAA or DRAM) that may be modeled by OCD modeling, but pre-layer parameters may have a spectral response that are difficult to de-couple from key parameters of current layers. In some implementations, the unknown structure 104 may be periodic and may have the same (or different) periodicity as the SOI 102, but the unknown structure 104 may have a different sensitivity to optical metrology than the SOI 102, e.g., different sensitive wavelength regions, different spectral sensitivity signatures, etc., rendering modeling of the unknown structure 104 impossible.

Accordingly, during optical measurement of the sample 100 with incident light 110, the light returned by the sample over the ROI 101 in response to incident light 110 will include light that is returned from the SOI 102 combined with light returned from the unknown structure 104. Accordingly, the use of conventional OCD modeling of the sample 100, which includes the SOI 102 and the unknown structure 104 is impossible.

Figure 2:
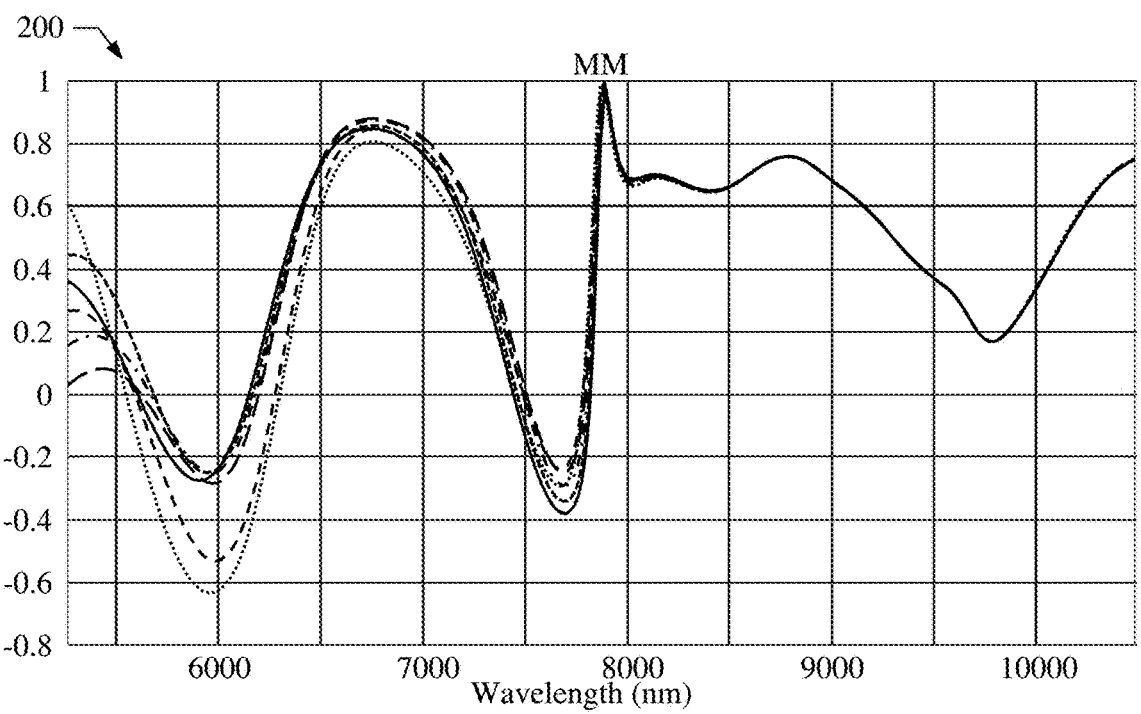
FIG. 2 is a graph illustrating examples of the data that may be collected from a sample shown in FIG. 1

FIG. 2, by way of example, is a graph 200 illustrating examples of the data that may be collected from a sample 100 shown in FIG. 1. The data in graph 200, for example, illustrates spectral data for a Mueller matrix (MM) element between approximately 530 nm and 1050 nm Each curve illustrated in FIG. 2 represents the MM spectral data for one measurement location on the sample 100 (e.g., corresponding to incident light 110 on sample 100 shown as arrows in FIG. 1). As can be seen, over the same ROI 101 of the sample 100, the collected spectra may have a large variation from location to location, particularly in the shorter wavelength range, e.g., between 530 nm and 780 nm. As discussed above, there is little or no variation in the SOI 102 across the ROI 101, while the unknown structure 104 varies across the ROI 101, and accordingly, variation in the collected data from location to location within the ROI 101 is primarily due to the variation in the unknown structure 104 within the ROI 101. While a single MM element is illustrated in FIG. 2, it should be understood that other MM elements and other types of metrology data, such as ellipsometric data including Psi & Delta data, Jones matrix, partial or full Mueller matrix, etc., reflectometric data including reflectance collected at different polarizer angles and/or different angles of incidence (AOIs), interferometric data including spectra in frequency domain, Fourier-Transform Infrared Spectroscopy (FTIR) data, etc., may have a similarly large variation over the ROI 101.

Figure 3:
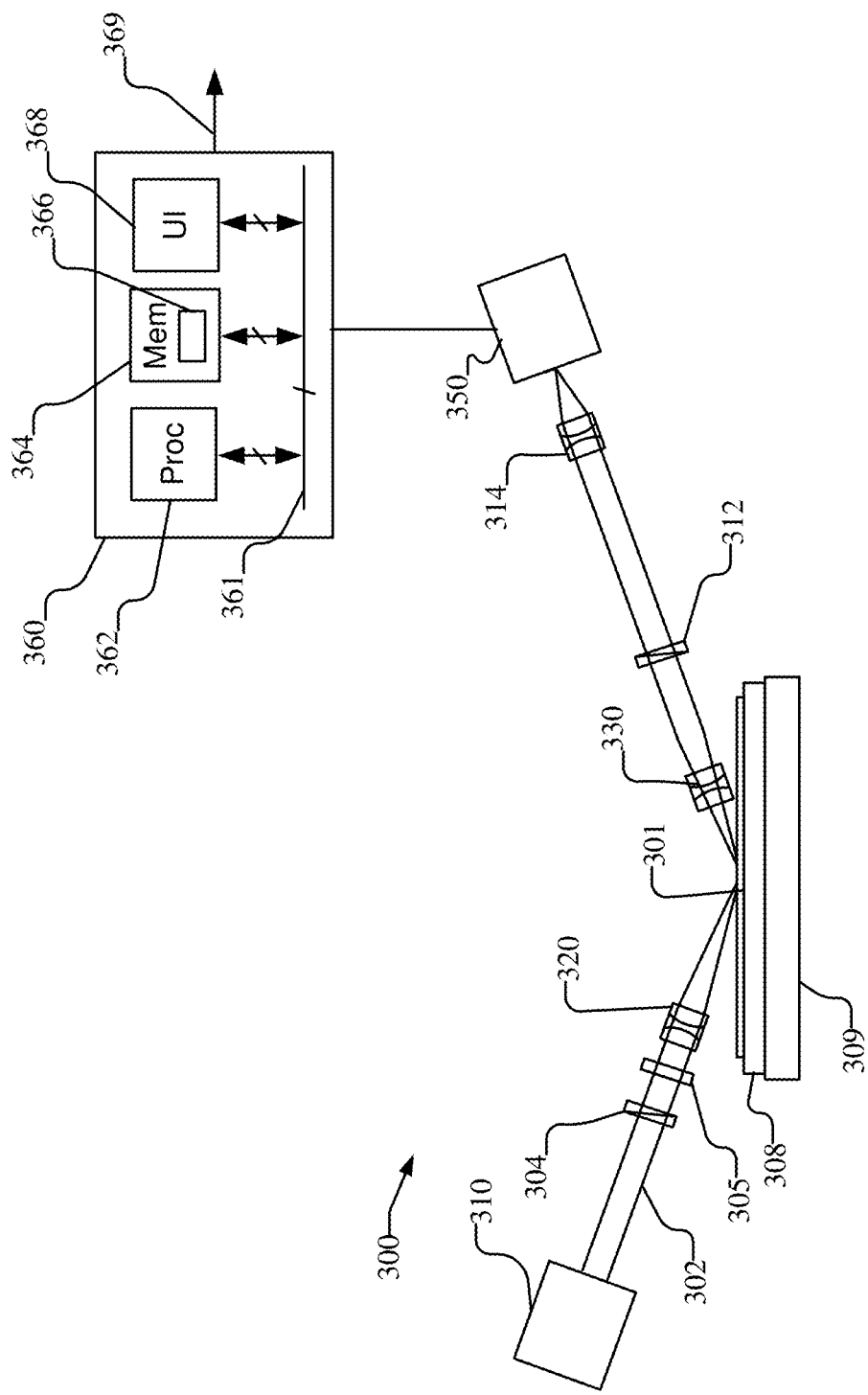
FIG. 3 illustrates a schematic view of an optical metrology device that may be used to measure a target structure including an SOI and unknown structuring as discussed herein.

FIG. 3, by way of example, illustrates a schematic view of an optical metrology device 300 that may be used to generate metrology data from a test sample and to process the metrology data to remove or reduce the spectral effect due to an unknown structure, as described herein. The optical metrology device 300 may be configured to perform, e.g., spectroscopic reflectometry, spectroscopic ellipsometry (including Mueller matrix ellipsometry), spectroscopic scatterometry, overlay scatterometry, interferometry, or FTIR measurements, of a sample 301 that includes a SOI 102 having a known structure and a section having an unknown structure 104 that is optically coupled to the SOI, e.g., as discussed in reference to FIG. 1. It should be understood that optical metrology device 300 is illustrated as one example of a metrology device, and that if desired other metrology devices may be used, including normal incidence devices, non-polarizing devices, etc.

Optical metrology device 300 includes a light source 310 that produces light 302. The light 302, for example, UV-visible light with wavelengths, e.g., between 200 nm and 1000 nm. The light 302 produced by light source 310 may include a range of wavelengths, i.e., continuous range or a plurality of discrete wavelengths, or may be a single wavelength. The optical metrology device 300 includes focusing optics 320 and 330 that focus and receive the light and direct the light to be obliquely incident on a top surface of the sample 301. The optics 320, 330 may be refractive, reflective, or a combination thereof and may be an objective lens.

The reflected light may be focused by lens 314 and received by a detector 350. The detector 350, may be a conventional charge coupled device (CCD), photodiode array, CMOS, or similar type of detector. The detector 350 may be, e.g., a spectrometer if broadband light is used, and detector 350 may generate a spectral signal as a function of wavelength. A spectrometer may be used to disperse the full spectrum of the received light into spectral components across an array of detector pixels. One or more polarizing elements may be in the beam path of the optical metrology device 300. For example, optical metrology device 300 may include one or both (or none) of one or more polarizing elements 304 in the beam path before the sample 301, and a polarizing element (analyzer) 312 in the beam path after the sample 301, and may include one or more additional elements, such as a compensator or photoelastic modulator 305, which may be before, after, or both before and after the sample 301.

Optical metrology device 300 further includes one or more computing systems 360 that is configured to perform measurements of one or more parameters of the sample 301 using the methods described herein. The one or more computing systems 360 is coupled to the detector 350 to receive the metrology data acquired by the detector 350 during measurement of the structure of the sample 301. The one or more computing systems 360, for example, may be a workstation, a personal computer, central processing unit or other adequate computer system, or multiple systems. The one or more computing systems 360 may be configured to perform optical metrology based on spectral processing or feature extraction to eliminate or reduce undesired spectral signals, e.g., in accordance with the methods described herein.

It should be understood that the one or more computing systems 360 may be a single computer system or multiple separate or linked computer systems, which may be interchangeably referred to herein as computing system 360, at least one computing system 360, one or more computing systems 360. The computing system 360 may be included in or is connected to or otherwise associated with optical metrology device 300. Different subsystems of the optical metrology device 300 may each include a computing system that is configured for carrying out steps associated with the associated subsystem. The computing system 360, for example, may control the positioning of the sample 301, e.g., by controlling movement of a stage 309 that is coupled to the chuck. The stage 309, for example, may be capable of horizontal motion in either Cartesian (i.e., X and Y) coordinates, or Polar (i.e., R and θ) coordinates or some combination of the two. The stage may also be capable of vertical motion along the Z coordinate. The computing system 360 may further control the operation of the chuck 308 to hold or release the sample 301. The computing system 360 may further control or monitor the rotation of one or more polarizing elements 304, 312, 305, etc.

The computing system 360 may be communicatively coupled to the detector 350 in any manner known in the art. For example, the one or more computing systems 360 may be coupled to a separate computing systems that is associated with the detector 350. The computing system 360 may be configured to receive and/or acquire metrology data or information from one or more subsystems of the optical metrology device 300, e.g., the detector 350, as well as controllers polarizing elements 304, 312, 305, etc., by a transmission medium that may include wireline and/or wireless portions. The transmission medium, thus, may serve as a data link between the computing system 360 and other subsystems of the optical metrology device 300.

The computing system 360, which includes at least one processor 362 with memory 364, as well as a user interface (UI) 368, which are communicatively coupled via a bus 361. The memory 364 or other non-transitory computer-usable storage medium, includes computer-readable program code 366 embodied thereof and may be used by the computing system 360 for causing the at least one computing system 360 to control the optical metrology device 300 and to perform the functions including the analysis described herein. The data structures and software code for automatically implementing one or more acts described in this detailed description can be implemented by one of ordinary skill in the art in light of the present disclosure and stored, e.g., on a computer-usable storage medium, e.g., memory 364, which may be any device or medium that can store code and/or data for use by a computer system, such as the computing system 360. The computer-usable storage medium may be, but is not limited to, include read-only memory, a random access memory, magnetic and optical storage devices such as disk drives, magnetic tape, etc. Additionally, the functions described herein may be embodied in whole or in part within the circuitry of an application specific integrated circuit (ASIC) or a programmable logic device (PLD), and the functions may be embodied in a computer understandable descriptor language which may be used to create an ASIC or PLD that operates as herein described.

The computing system 360, for example, may be configured to obtain optical metrology data from a plurality of measurement sites on one or more samples, e.g., calibration or training samples, wherein each measurement site comprises a structure-of-interest (SOI) having a set of known parameters and an unknown structure that has unknown parameters, wherein the optical metrology data comprises spectral signals. The computing system 360 may be configured to extract spectral variations correlated with key parameters associated with the SOI from the spectral signals, and to generate metrology solutions for optical measurement of the SOI based on the spectral variations correlated with key parameters associated with the SOI. For example, the metrology solutions may include a generating a model for optical measurement that includes a rigorous model that represents the SOI and an effective model that represents the unknown structure and that is generated based on the reconstructed spectral signals. In another example, the metrology solutions may include a machine learning recipe that is generated based on the spectral variations correlated with key parameters associated with the SOI. In some implementations, a different computing system and/or different optical metrology device may be used to acquire the metrology data from training samples and generate a model or trained neural network, and the resulting model and/or trained neural network may be provided to the computing system 360, e.g., via the computer-readable program code 366 on non-transitory computer-usable storage medium, such as memory 364.

The computing system 360 may be used to acquire metrology data, that includes a spectral signal, using the optical metrology device 300 from the test (target) sample. The metrology data may be the same type used to generate the model or train the neural network and the test (target) sample has the same structure, e.g., with the SOI 102 and unknown structure 104, as the training samples. The computing system 360 may be configured to generate a filtered spectral signal to remove from the spectral signal spectral effects from the unknown structure that has unknown parameters. The computing system 360 may be configured to determine one or more parameters of the SOI using the filtered spectral signal and a model for the measurement site that includes a rigorous model that represents the SOI and an effective model that represents the unknown structure. The computing system 360 may be configured to determine one or more parameters of the SOI using the spectral signal and a machine learning recipe for the measurement site.

The results from the analysis of the data may be reported, e.g., stored in memory 364 associated with the sample 301 and/or indicated to a user via UE 368, an alarm or other output device. Moreover, the results from the analysis may be reported and fed forward or back to the process equipment to adjust the appropriate fabrication steps to compensate for any detected variances in the fabrication process. The computing system 360, for example, may include a communication port 369 that may be any type of communication connection, such as to the internet or any other computer network. The communication port 369 may be used to receive instructions that are used to program the computing system 360 to perform any one or more of the functions described herein and/or to export signals, e.g., with measurement results and/or instructions, to another system, such as external process tools, in a feed forward or feedback process in order to adjust a process parameter associated with a fabrication process step of the samples based on the measurement results.

The computing system 360 of the optical metrology device 300 may be configured to effectively extract variations in spectral signal (X) that are correlated with key-parameters (Y) and remove the variations in the spectral signal (X) that is irrelevant to make predictions of the key parameters (Y). The process may include an offline set up, in which the recipe for modeling, e.g., OCD modeling, is generated or a machine learning recipe is trained. The process may further include an in-line measurement process in which the model, e.g., OCD model, or the machine learning model is used to measure a sample. The process may be used to filter out undesired spectral effect and reconstruct the spectral signal that are used as inputs, e.g., for OCD modeling or machine learning. This results in enabling modeling for structures with unknown and/or non-periodic under-layer structures or to extend usable wavelengths in modeling with improved sensitivity and reduced correlation, thereby improving overall metrology performance. The process may be used for development of a pure machine learning solution for OCD metrology, with benefit of improved recipe robustness and stability from decoupling spectral contribution of key parameters from non-key parameters. The use of PLS, or its variants, or other similar methods, aim to simultaneously extract the maximum variance within the spectral signal (X), within the key parameter(s) (Y), and find the strongest relationship between them. This process can inherently down weight confounding variances by considering not only spectral variation, but also the variation in the key parameters (Y) in a single ML model with typically less latent variables required.

Figure 4:
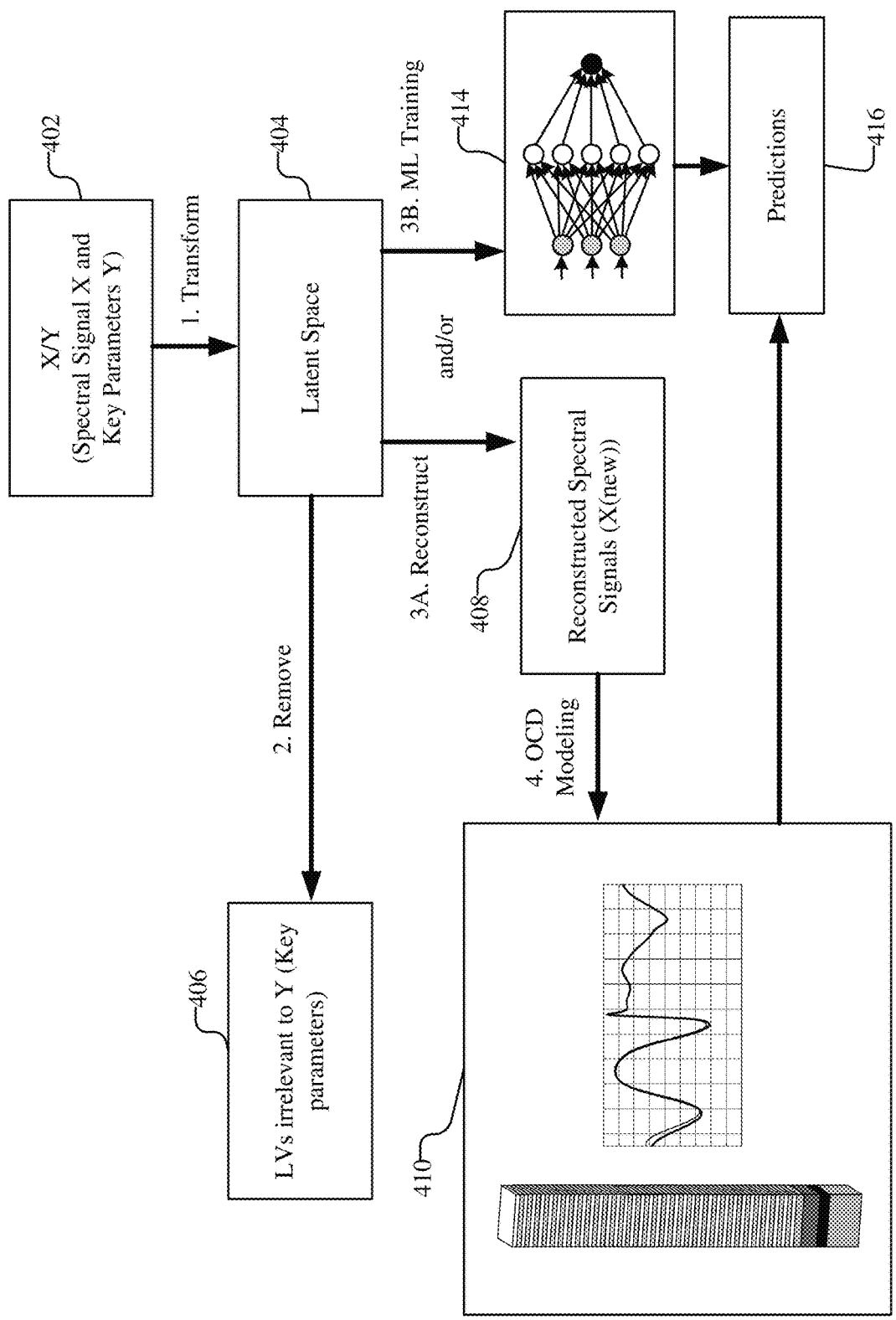
FIG. 4 schematically illustrates a process for offline recipe generation to remove undesired spectral variations from an unknown structure and generate a model of the sample or train a machine learning model. e.g., a neural network.

FIG. 4 schematically illustrates a process 400 for offline recipe generation to remove undesired spectral variations, e.g., extract variations in the spectral signal (X) that are correlated with key-parameters (Y) and remove (or reduce) the variations in the spectral signal (X) that is irrelevant to make predictions on the key parameters (Y). Process 400 may be performed, for example, by the optical metrology device 300 using optical metrology data comprising spectral signals (X) that are obtained from a plurality of measurement sites from one or more samples. Each measurement site includes an SOI having a set of known parameters and an unknown structure having a set of unknown parameters, e.g., as illustrated by sample 100 shown in FIG. 1. The optical metrology data, for example, may be ellipsometric data, reflectometric data, interferometric data, FTIR data, etc., or a combination thereof. The optical metrology data, for example, may be obtained from multiple sites from a sample or multiple samples. In the calibration or training samples, the known parameters of the SOI may have known values, e.g., the values of the CDs, film thicknesses, sidewall angles, etc., in the SOI are known.

As illustrated at stage 1, the spectral signals (X), e.g., ellipsometric data, reflectometric data, interferometric data, FTIR data, etc., or a combination thereof, and key parameters (Y) from the plurality of measurements sites from the one or more calibration samples (block 402) are processed, e.g., using feature extraction, to extract spectral variations of the spectral signals (X) that are correlated with key parameters (Y) and are transformed into a latent space (block 404). The feature extraction and transformation to latent space, for example, may use PLS, OPLS, PLS Canonical, Canonical Correlation Analysis (CCA), PCA, ICA, or a non-linear analysis, such as Kernel Partial Least Squares (KPLS), Kernel Principal Component Analysis (KPCA), or Non-Linear (Variational) Autoencoder, to extract the spectral variations that are correlated with the key parameters.

Figure 5A:
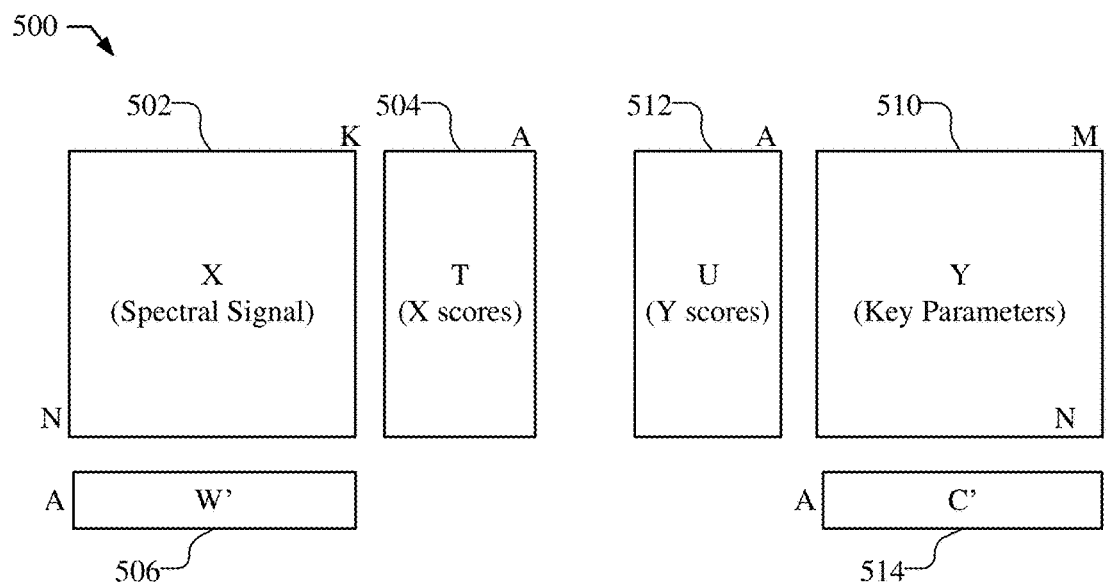
FIG. 5A shows a visualization of a Partial Least Squares (PLS) formulation that may be used to extract the spectral variations from the spectral signal that are correlated with key parameters.

FIG. 5A, by way of example, shows a visualization of PLS formulation 500 that may be used to extract the spectral variations from the spectral signal (X) that are correlated with key parameters (Y) in block 402 of FIG. 4.

The PLS formulation 500 iteratively decomposes the spectral signal X into X-scores T (including an error term E) and the key parameters Y into Y-scores U (including an error term F) by finding appropriate weights W and C as defined using equations (1)-(2).

$$X = TW' + E \tag{1}$$

$$Y = UC' + F \tag{2}$$

Equations (1) and (2) are solved iteratively. In the first iteration, the 1st column of W' and C' are found to maximize the covariance of T and U; E and F are calculated as variance of X and Y that are not explained by the first latent variable (LV); and in a next iteration, E becomes the new X, F becomes the new Y, the same operation repeats until A LVs are found. Thus, the PLS formulation 500 is illustrated with the spectral signal decomposed into a N by K spectral matrix (X) 502 for the spectral signal, where K is the number of spectral features (e.g., pixels) and N is the number of samples; an N by A matrix (T) 504 of X scores, where the columns (A) is the number of latent variables and the rows (N) are the samples; and an A by K matrix (W') 506 of the X-space weights. The key parameter(s) are decomposed into a N by M vector (M=1) or matrix (M>1) (Y) 510 of key parameters, where the column (M) is the number of key parameters and the rows (N) are the samples; an N by A matrix (U) 512 of Y scores, where LVs are columns (A) and samples are rows (N); and an A by M matrix (C') 514 of Y-space weights, where weights are columns (M) and LVs are rows (A). The decomposition of the spectral signals X and key parameters Y is performed using PLS with an aim to extract a single set of latent variables (LVs) from matrices X and Y simultaneously with the three simultaneous objectives: 1) extract the maximum spectral signal (X) variation, 2) extract the maximum variation of the key parameters (Y), and 3) find the strongest relationship between spectral signal (X) and key parameters (Y). The optimal number of PLS orthogonal LVs may be determined using cross-validation.

Figure 5B:
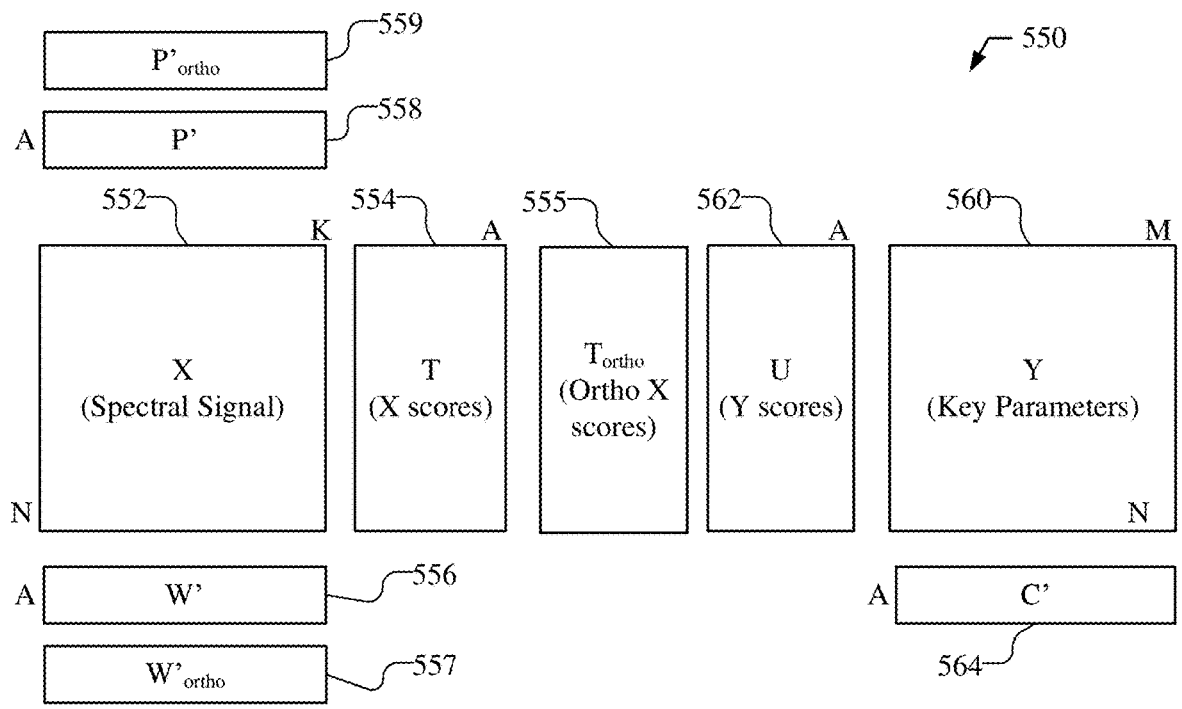
FIG. 5B shows a visualization of an Orthogonal PLS (OPLS) formulation that may be used to extract the spectral variations from the spectral signal that are correlated with key parameters.

FIG. 5B, by way of example, shows a visualization of Orthogonal PLS (OPLS) formulation 550 that may be used to extract the spectral variations from the spectral signal (X) that are correlated with key parameters (Y) in block 402 of FIG. 4.

The OPLS formulation 550 maximizes the covariance of the spectral signals X and key parameters Y in the first latent variable (LV), while capturing the remaining variance in the rest of the LVs which are orthogonal. Similar to the PLS formulation 500 discussed in FIG. 5A, the OPLS formulation 550 iteratively decomposes the spectral signal X into X-scores T (and an error term E) and the key parameters Y into Y-scores U by finding appropriate weights W and C (and an error term F), and additionally, finds X-loadings P', orthogonal X-loadings P'$_{ortho}$, orthogonal X-space weights W'ortho®, and orthogonal X-scores T$_{ortho}$.

$$X = TW' + T_{ortho}W'_{ortho} + E \quad (3)$$

$$Y = UC' + F \quad (4)$$

Thus, the OPLS formulation 550 is illustrated with the spectral signal decomposed into a N by K spectral matrix (X) 552 for the spectral signal, where K is the number of spectral features (e.g., pixels/wavelengths) and N is the number of samples; an N by A matrix (T) 554 of X scores, where the column (A) is the number of latent variables and the rows (N) are the samples; an N by A matrix (T$_{ortho}$) 555 of orthogonal X-scores, where, T$_{ortho}$ represents a matrix of orthogonal X-scores; a A by K matrix (W') 556 of the X-space weights; a A by K matrix (W'$_{ortho}$) 557 of orthogonal X-space weights; a A by K matrix (P') 558 of the X-loadings; a A by K matrix P'$_{ortho}$) 559 of orthogonal X-loadings, where weights are columns (K) and LVs are rows (A). The key parameters are decomposed into a N by M vector (M=1) or matrix (M>1) (Y) 560 of key parameters, where M is the number of key parameters; an N by A matrix (U) 562 of Y scores; and an A by M matrix (C') 564 of Y-space weights. The decomposition of the spectral signals X and key parameters Y is performed using OPLS with an aim separate the X variation correlated to Y, the orthogonal signal uncorrelated to Y, and the residual variation. The optimal number of OPLS orthogonal LVs may be determined using cross-validation.

The use of OPLS or PLS can inherently down-weight the irrelevant latent variables (LVs) and effectively remove them, in order to filter out undesired spectral effects orthogonal to the desired spectral effects; however, a selection of combinations of (orthogonal) latent variables may be advantageous. The selection of combinations of latent variables can be demonstrated in the following example where ICA is used in conjunction with PLS. ICA is a process used for source separation purpose, by optimizing for maximal independence between different latent variables. The undesired spectral variation from the unknown structure and the desired spectral variation, e.g., the spectral signal that excludes the spectral variation due to unknown structures, can be separated in the spectral signal (X) using ICA. In one method, ICA may be performed on latent variables obtained by PLS. The resulting ICA LVs are effectively weighted sum of PLS LVs, e.g., ICA_LV1=a*PLS_LV1+b*PLS_LV2+ c*PLS_LV3, with a, b, c being real numbered constants. The selection of combinations of PLS LVs are done by maximizing independence between resulting ICA LVs, which may potentially lead to a clear separation between undesired and desired spectral variation. The latent variables identified by ICA may be cross-checked with the key parameters (Y), to select those representing undesired spectral variation.

While FIGS. 5A and 5B illustrate PLS and OPLS, respectively, it should be understood that the spectral variations from the spectral signal (X) that are correlated with key parameters (Y) may be extracted in block 402 of FIG. 4 using other methods may be used, such as variants of PLS, such as PLS Canonical, or other latent variable methods, such as principal component analysis (PCA), independent component analysis (ICA), or a non-linear analysis.

While OPLS-PLS is using orthogonality constraints to identify undesired spectral variation, and ICA is using independence as constraints to identify undesired spectral variation, other alternative approaches may include designing specific constraints for a specific problem. For example, constraints for a sample that produces spectral variation due to an unknown structure, the latent variable representing the undesired spectral variation may possess, e.g., a) the maximal amount of variance of the latent variable extracted from ICU spectra data, and b) at the same time, a minimal amount of variance of the same latent variable extracted from the spectral data (X). The designed specific constraint in this approach is a)+b), and to find the loadings for the extraction of the latent variable that satisfy a)+b), a solution may be found, e.g., by a weighted sum of the loadings in a trained PLS model. The undesired spectral variation may be determined by optimizing the weights such that the designed specific constraints of a)+b) are satisfied.

Once the spectral signals (X) and correlated key parameters (Y) are in latent space 404, undesired spectral variations in the spectral signal (X) may be removed. For example, as illustrated by stage 2, the latent variables (LVs) from latent space (block 404) that are irrelevant to the key parameters (Y) are removed (block 406), while LVs that are relevant to the key parameters (Y) are retained. At stage 3A, after removal of the LVs that are irrelevant to the key parameters (Y), the spectral signal for the samples may be reconstructed based on the remaining LVs as reconstructed spectral signals (X(new)) in block 408. The reconstructed spectral signal (X(new)) thus is a PLS or OPLS treated spectral signal.

There are two approaches that may be used to exclude or reduce the undesired spectral variations in the spectral signal (X) by removing the LVs that are relevant to the key parameters (Y). In one approach, referred to as the forward approach, the variance of key parameters (Y) are associated with the desired spectral variation (e.g., from the SOI of the sample). In the forward approach, for example, spectra can be collected on a number of targets for which the SOI have intentionally introduced a variation of key parameters in its profile, while the undesired unknown structures are kept the same. The spectral variations associated with such collection of targets are considered primarily from the signals of desired key parameters. Accordingly, the LVs removed at stage 2 (to block 406) are irrelevant to key parameters (Y) and are not associated with the desired spectral variation. The retained LVs are relevant to the key parameters (Y), which are associated with the desired spectral variation and may be used to obtain the reconstructed spectral signal (X(new)) at stage 3A (to block 408).

In some implementations, in the forward approach, all the OPLS orthogonal LVs (non-correlated to key parameters (Y)) may be removed to filter out the underlayer effect, e.g., the effect of the unknown structure. In some implementations, however, a percentage of explained variance in X and Y, e.g., min $R^2(X)$ for max $R^2(Y)$, may be used as a guide to remove a subset of OPLS LVs, which may lead to better performance. The percentage of explained variance in spectral signals X and the percentage of explained variance in key parameters Y may be written as follows.

$$R^2(X) = 1 - \frac{\text{Var}(E)}{\text{Var}(X)} = 1 - \frac{\text{Var}(X(\text{new})-X)}{\text{Var}(X)} \quad (5)$$

$$R^2(Y) = 1 - \frac{\text{Var}(Y(\text{predicted})-Y)}{\text{Var}(Y)} \quad (6)$$

The parameter Y(predicted) in equation (6) is the predicted key parameters once the LVs that are not relevant to key parameters (Y) are removed.

In another approach, referred to as the backward approach, the variance of key parameters (Y) are associated with the undesired spectral variation (e.g., from the unknown structure of the sample). In backward approach, spectra may be collected on a number of targets for which the SOI have similar profiles while the undesired unknown structures differ from each other. The spectral variations associated with such collection of targets are considered primarily from the variation of undesired unknown structures. Accordingly, after removing the LVs at stage 2 (to block 406), the LVs that are retained are irrelevant to the key parameters (Y) which are associated with undesired spectral variation. The reconstructed spectral signal (X(new)) at stage 3A (to block 408) may be generated in the backward approach by using the retained LVs to reconstruct a spectral signal delta ($\Delta X$), which is representative of the undesired spectral variation, and the spectral signal delta may be subtracted from the original spectral signal (X) to obtain the reconstructed spectral signal (X(new)) at stage 3A (to block 408), i.e., X(new)=X−$\Delta X$.

At stage 4, the reconstructed spectral signal (X(new)) may be used to generate a physics-based model (block 410) for the sample. The reconstructed spectral signal (X(new)) does not include undesired spectral variations, e.g., spectral variations due to the unknown structure, but may include unvarying spectral components that are due to the unknown structure. In other words, the reconstructed spectral signal (X(new)) may include components from the SOI of the sample, as well as some unvarying components from the unknown structure. Accordingly, the model that is generated for the sample may include a rigorous model for the SOI and an effective model for the unvarying spectral components due to the unknown structure. The rigorous model for the SOI is an accurate representation of the physical structure of the SOI with one or more variable parameters to be measured/characterized. The effective model for the unknown structure, on the other hand, does not attempt to accurately represent the physical structure of the unknown structure (which is not known), but instead is a representation of a structure that is capable of producing the spectral components of the reconstructed spectral signal (X(new)) contributed by the unknown structure after removal of the undesired spectral variation. The model of the sample, for example, may be generated using a rigorous model for the SOI produced based on the known parameters for the SOI in the calibration samples that produced the spectral signal (X) and an effective model for the unknown structure produced based on an approximation of the unknown structure with one or more variable parameters. The predicted spectral signal from the model may be compared to the reconstructed spectral signal (X(new)). The structure, materials, and variable parameters of the effective model may be varied until an acceptable fit can be achieved, which then may be used as the parameters of the effective model for the final model of the sample. In some implementations, the final model of the sample may include variable parameters for the effective model. In some implementations, the model for the sample may include a library of modeled data, e.g., generated using RCWA, FDTD, FEM, etc., that is associated with different values of the variable parameters in the model. In other implementations, the modeled data may be generated in real time during in-line measurement of a sample.

Figure 6:
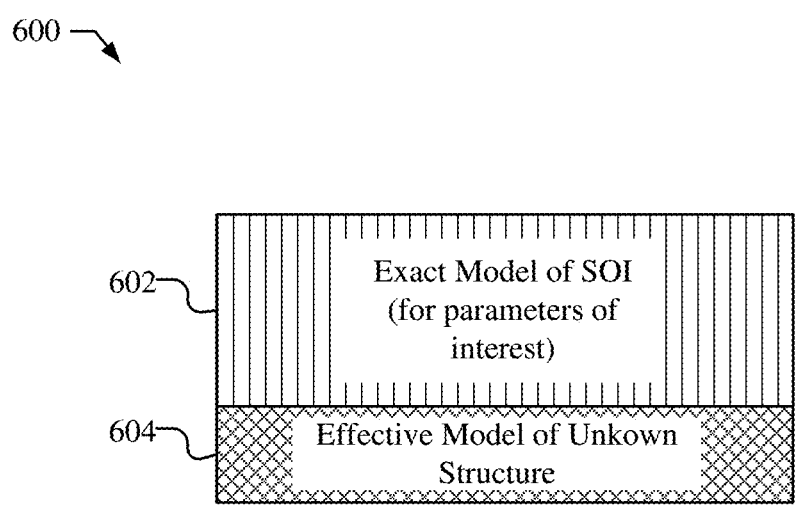
FIG. 6 illustrates an example of a model of the sample that includes a rigorous model for the SOI and an effective model for the unknown structure.

FIG. 6, by way of example, illustrates an example of a model 600 of the sample 100 illustrated in FIG. 1, that includes a rigorous model 602 for the SOI 102 and an effective model 604 for the unknown structure 104. The rigorous model 602 of the SOI 102 includes one or more variable parameters, which may include the parameters of the SOI 102 to be measured. The effective model 604 for the unknown structure 104 is based on the parameters determined from the fit to the reconstructed spectral signal (X(new)). In some implementations, the model 600 may include variable parameters for the effective model. Thus, when predicted data is generated using the model 600, the predicted data will include a combination of the spectral contributions from the rigorous model 602 for the SOI 102 and the unvarying spectral contributions from the effective model 604 for the unknown structure 104. The resulting model produced based on the PLS or OPLS treated spectral signal may effectively decouple the relevant from non-relevant spectral information.

Referring back to FIG. 4, the physics-based model generated in block 410 is provided to the predictions (416).

In some implementations, rather than or in addition to generating a model based on the reconstructed spectral signal (X(new)) (from block 408), a machine learning (ML) recipe may be generated based on the spectral variations in the spectral signal (X) that are correlated with key parameters (Y) that are associated with the SOI. For example, as illustrated by stage 3B, once the undesired spectral variations in the spectral signal (X) are removed from the spectral signals (X) and correlated key parameters (Y), the spectral signals may be used for machine learning, such as to train a neural network (block 414). In some implementations, the training of the neural network may include reconstructing the spectral signal (block 408), e.g., using the forward approach or backward approach, and using the reconstructed spectral signal (X(new)) to train a machine learning model such as a neural network. In some implementations, a machine learning model or recipe training approach may be used with the remaining LVs from the latent space 404 after the LVs that are irrelevant to the key parameters (Y) are removed. For example, the machine learning model may be an iterative approach in which predictions (416) for parameter values characterizing the SOI are generated based on the data and are fed back a predetermined number of times or until further improvement of the predictions are not achieved.

With the model for the sample generated (e.g. block 410) and/or the machine learning model or recipe training (e.g., block 414) to generate predictions (e.g., block 416), an in-line measurement process may be used to measure a sample having a SOI and unknown structure.

Figure 7:
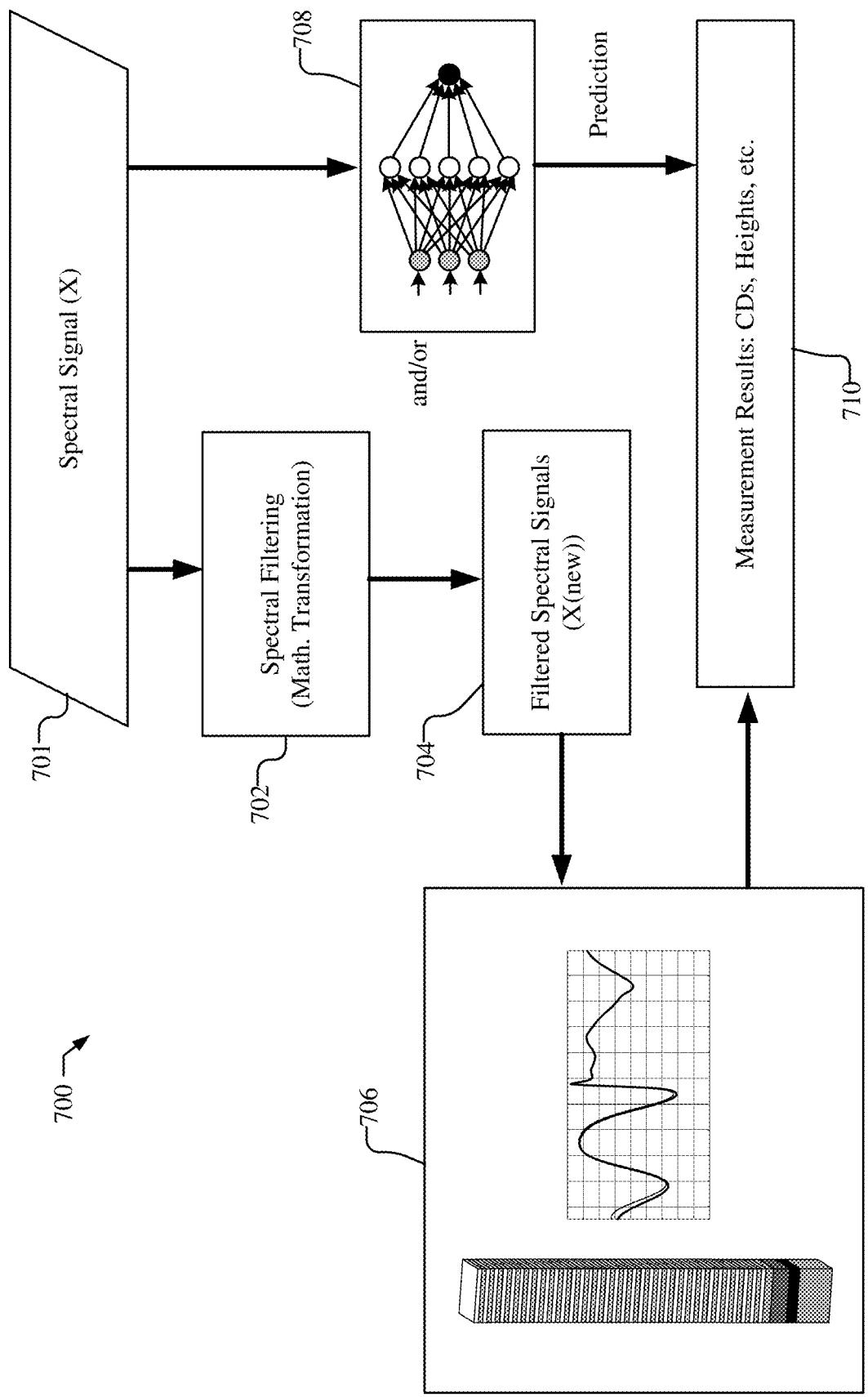
FIG. 7 schematically illustrates a process for in-line measurement of a sample using the model of the sample or trained machine learning model such as a neural network.

FIG. 7 schematically illustrates a process 700 for in-line measurement of a sample under test.

The optical metrology data, e.g., which includes spectral signal (X), is obtained from the sample under test (block 701), e.g., by the optical metrology device 300. The optical metrology data, for example, may be ellipsometric data, reflectometric data, interferometric data, FTIR data, etc., or a combination thereof. The sample may be the same as the calibration or training samples used to generate the model or train the neural network, and include an SOI having a set of known parameters and an unknown structure having a set of unknown parameters, e.g., as illustrated by sample 100 shown in FIG. 1. In the sample under test, however, the values of the known parameters of the SOI are to be determined by the measurement.

The spectral signal (X) is filtered (block 702) to remove the spectral effects from the unknown structure to produce filtered spectral signal (X(new)) (block 704). For example, the spectral signal (X) may be filtered by removing specific wavelengths that are correlated to spectral variations due to the unknown structure and that show no or little response to the changes in variable parameters of the model and/or to linearly or non-linearly transform the wavelengths of the spectral signal (X) to match signals with the spectral effects from the unknown structure removed. In some implementations, the spectral signal (X) may be filtered to remove the spectral effects from the unknown structure similar to the process used in FIG. 4, e.g., using PLS, OPLS, PLS PCA, ICA, or a non-linear analysis, such as KPLS, KPCA, or Non-Linear (Variational) Autoencoder. For example, the spectral signal (X) may be transformed to a latent space, LVs that are associated with undesired spectral effects associated with the unknown structure may be removed from the transformed spectral signal to create a removed latent variables, and reconstructed spectral signal may be generated using the transformed spectral signal, e.g., using the forward approach or the backward approach, to produce the filtered spectral signal (X(new)).

At block 706, the modeled data generated from a model is fit to the filtered spectral signal (X(new)) to determine one or more parameters for the sample. The modeled data, for example, is produced using the rigorous model for the SOI and the effective model for the unknown structure, e.g., obtained at block 410 in FIG. 4, e.g., using RCWA, FDTD, FEM, etc. The modeled data, thus, is a combination of rigorously modeled data for the SOI and the effectively modeled data for the unknown structure. The filtered spectral signal (X(new)) may be compared to the modeled data, which may be stored in the library or determined in real time. The variable parameters of the model and the associated modeled data is compared to the filtered spectral signal (X(new)) to find a best fit, e.g., based on the Mean-Squared Error (MSE). When a best fit is found, the values of the variable parameters of the rigorous model of the SOI may be assumed to accurately describe the SOI under test.

The measured parameters for the measurement site of the sample may be reported, e.g., at block 710. As discussed above, the report for the measurement parameters may include storing the results, providing an indication of the results to a user, e.g., via a display, alarm, etc., or feeding the results forward or back to adjust the appropriate fabrication steps.

If additional measurement sites are to be measured, the process may return, e.g., to block 701 for the new measurement location on the sample, e.g., after moving the sample and/or optics of the metrology device to measure the new location, and the process repeats. In some implementations, the measurement results (block 710) are reported after all measurement sites of the sample have been measured.

In some implementations, rather than or in addition to using a model of the sample, a machine learning recipe may be used to determine one or more parameters for the measurement site of the sample. For example, the optical metrology data, e.g., spectral signal (X), obtained from the sample under test (block 701) may be provided to the machine learning model or trained recipe (block 708), e.g., trained at block 414 of FIG. 4. The one or more parameters of the SOI may be predicted based on the trained machine learning model or trained recipe using the spectral signal (X) or the reconstructed signal X(new) and/or the retained latent variables for the measurement site and reported at block 710.

Figure 8:
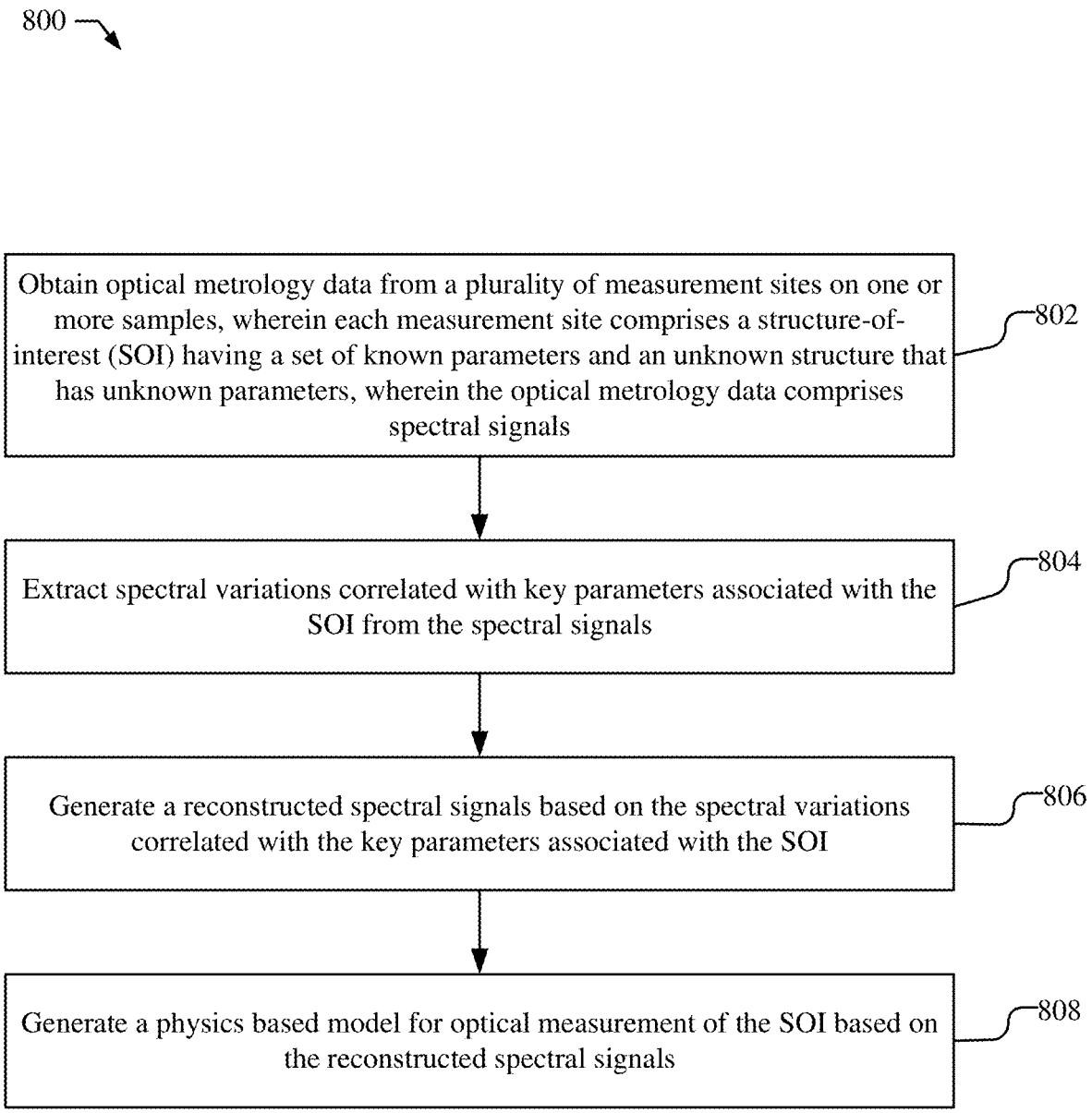
FIG. 8 is a flow chart illustrating a method for optical measurement of a sample, as discussed herein.

FIG. 8 is a flow chart 800 illustrating a method for optical measurement of a sample, as discussed herein. The method, for example, is for an offline recipe generation to remove undesired spectral variations, e.g., extract variations in the spectral signal (X) that are correlated with key-parameters (Y) and remove (or reduce) the variations in the spectral signal (X) that is irrelevant to make predictions on the key parameters (Y). The method may be performed, e.g., by the optical metrology device 300 shown in FIG. 3, when measuring a sample such as that shown in FIG. 1.

At block 802, optical metrology data is obtained from a plurality of measurement sites on one or more samples, wherein each measurement site comprises a structure-of-interest (SOI) having a set of known parameters and an unknown structure that has unknown parameters, wherein the optical metrology data comprises spectral signals, e.g., as discussed in reference to block 401 of FIG. 4. The unknown structure may reside at a region that underlies the SOI, is on top of the SOI, is beside the SOI, or is coincident (e.g., intermixed or interweaved) with the SOI, e.g., as discussed in reference to sample 100 shown in FIG. 1. The optical metrology data may include at least one of ellipsometric data, reflectometric data, interferometric data, FTIR data, or a combination thereof.

At block 804, spectral variations correlated with key parameters associated with the SOI are extracted from the spectral signals, e.g., as discussed in reference to blocks 402, 404, and 406 of FIG. 4, and in reference to FIGS. 5A and 5B. A means for extracting spectral variations correlated with key parameters associated with the SOI from the spectral signals may include, e.g., one or more processors 362 of the computing system 360 with dedicated hardware or implementing executable code or software instructions 366 in memory 364 of the optical metrology device 300.

At block 806, reconstructed spectral signals are generated based on the spectral variations correlated with the key parameters associated with the SOI one approach, e.g., as discussed in reference to blocks 404, 406, and 408 of FIG. 4. A means for generating a reconstructed spectral signals based on the spectral variations correlated with the key parameters associated with the SOI may include, e.g., one or more processors 362 of the computing system 360 with dedicated hardware or implementing executable code or software instructions 366 in memory 364 of the optical metrology device 300.

At block 808, a physics-based model for optical measurement of the SOI is generated based on the reconstructed spectral signals, e.g., as discussed in reference to blocks 408, 410, and 416 of FIG. 4. A means for generating a physics-based model for optical measurement of the SOI based on the reconstructed spectral signals may include, e.g., one or more processors 362 of the computing system 360 with dedicated hardware or implementing executable code or software instructions 366 in memory 364 of the optical metrology device 300.

In some implementations, the spectral variations correlated with key parameters associated with the SOI may be extracted from the spectral signals, by transforming the spectral signals to a latent space and identifying spectral variations correlated with key parameters in the latent space, e.g., as discussed in reference to blocks 402, 404, and 406 of FIG. 4, and in reference to FIGS. 5A and 5B. A means for transforming the spectral signals to a latent space and identifying spectral variations correlated with key parameters in the latent space may include, e.g., one or more processors 362 of the computing system 360 with dedicated hardware or implementing executable code or software instructions 366 in memory 364 of the optical metrology device 300. The spectral signals may be transformed to the latent space based on at least one of Partial Least Squares (PLS), Orthogonal PLS (OPLS), PLS Canonical, Canonical Correlation Analysis (CCA), Principal Component Analysis (PCA), or Independent Component Analysis (ICA), or a non-linear analysis, such as KPLS, KPCA, or Non-Linear (Variational) Autoencoder, e.g., as discussed in reference to blocks 402, 404 of FIG. 4, and in reference to FIGS. 5A and 5B.

In one approach, latent variables that are irrelevant to the key parameters associated with the SOI are removed and the reconstructed spectral signals based on the spectral variations correlated with the key parameters associated with the SOI are generated using retained latent variables that are relevant to the key parameters associated with the SOI, e.g., as discussed in reference to blocks 404, 406, and 408 of FIG. 4. A means for removing latent variables that are irrelevant to the key parameters associated with the SOI may include, e.g., one or more processors 362 of the computing system 360 with dedicated hardware or implementing executable code or software instructions 366 in memory 364 of the optical metrology device 300.

In another approach, latent variables that are relevant to undesired spectral variation may be extracted to create an extracted latent variables, a spectra delta may be constructed using the extracted latent variables that are relevant to undesired spectral variation, and the reconstructed spectral signals based on the spectral variations correlated with key parameters associated with the SOI uses the spectral signals and the spectra delta, e.g., as discussed in reference to blocks 404, 406, and 408 of FIG. 4. A means for extracting latent variables that are relevant to undesired spectra variation, and a means for constructing a spectra delta using the extracted latent variables that are relevant to undesired spectra variation may include, e.g., one or more processors 362 of the computing system 360 with dedicated hardware or implementing executable code or software instructions 366 in memory 364 of the optical metrology device 300.

In one example, the physics-based model comprises at least one of an optical critical dimension (OCD) model, a time resolved acoustic model, and an x-ray critical dimension model. The physics-based model, for example, may include a model for optical measurement that is generated based on the reconstructed spectral signals, wherein the model comprises a rigorous model that represents the SOI and an effective model that represents the unknown structure, e.g., as discussed in reference to block 410 of FIG. 4, and discussed in reference to FIG. 6.

In one example, the method further includes generating a machine learning model for optical measurement for the SOI, e.g., as discussed in reference to blocks 414 and 416 of FIG. 4. The machine learning model may include a machine learning recipe, e.g., as discussed in reference to block 414 of FIG. 4. A means for generating a machine learning model for optical measurement for the SOI may include, e.g., one or more processors 362 of the computing system 360 with dedicated hardware or implementing executable code or software instructions 366 in memory 364 of the optical metrology device 300.

Figure 9:
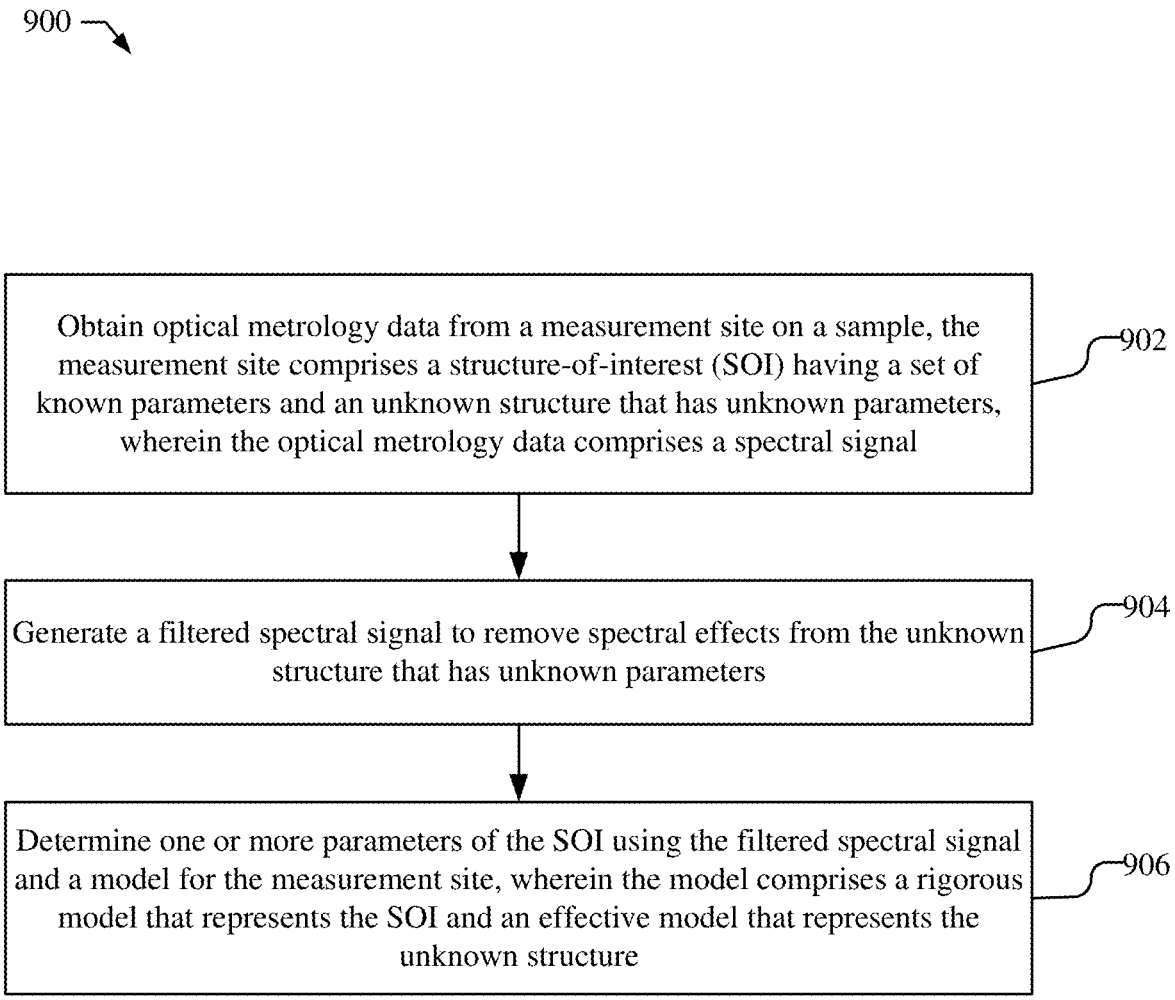
FIG. 9 is a flow chart illustrating a method for optical measurement of a sample, as discussed herein.

FIG. 9 is a flow chart 900 illustrating a method for optical measurement of a sample, as discussed herein. The method, for example, is for an in-line measurement of a sample under test. The method may be performed, e.g., by the optical metrology device 300 shown in FIG. 3, when measuring a sample such as that shown in FIG. 1.

At block 902, optical metrology data is obtained from a measurement site on a sample, the measurement site comprises a structure-of-interest (SOI) having a set of known parameters and an unknown structure that has unknown parameters, wherein the optical metrology data comprises a spectral signal, e.g., as discussed in reference to block 701 of FIG. 7. The unknown structure may reside at a region that underlies the SOI, is on top of the SOI, is beside the SOI, or is coincident (e.g., intermixed or interweaved) with the SOI, e.g., as discussed in reference to sample 100 shown in FIG. 1. The optical metrology data may include at least one of ellipsometric data, reflectometric data, interferometric data, FTIR data, or a combination thereof.

At block 904, the filtered spectral signal is generated to remove spectral effects from the unknown structure that has unknown parameters, e.g., as discussed in reference to block 702 of FIG. 7. For example, the filtered spectral signal may be generated based on at least one of Partial Least Squares (PLS), Orthogonal PLS (OPLS), PLS Canonical, Canonical Correlation Analysis (CCA), Principal Component Analysis (PCA), or Independent Component Analysis (ICA), or a non-linear analysis, such as KPLS, KPCA, or Non-Linear (Variational) Autoencoder. A means for generating a filtered spectral signal to remove spectral effects from the unknown structure that has unknown parameters may include, e.g., one or more processors 362 of the computing system 360 with dedicated hardware or implementing executable code or software instructions 366 in memory 364 of the optical metrology device 300.

At block 906, one or more parameters of the SOI are determined using the filtered spectral signal and a model for the measurement site, wherein the model comprises a rigorous model that represents the SOI and an effective model that represents the unknown structure, e.g., as discussed in reference to blocks 704, 706, and 710 of FIG. 7. A means for determining one or more parameters of the SOI using the filtered spectral signal and a model for the measurement site, wherein the model comprises a rigorous model that represents the SOI and an effective model that represents the unknown structure may include, e.g., one or more processors 362 of the computing system 360 with dedicated hardware or implementing executable code or software instructions 366 in memory 364 of the optical metrology device 300.

In one implementation, the filtered spectral signal may be generated by transforming the spectral signal to a latent space, e.g., as discussed in reference to block 702 of FIG. 7 and blocks 402 and 404 of FIG. 4, removing from the transformed spectral signal latent variables that are associated with undesired spectral effects associated with the unknown structure, e.g., as discussed in reference to block 702 of FIG. 7 and blocks 404 and 406 of FIG. 4, and generating a reconstructed spectral signal from the transformed spectral signal after removing the latent variables to produce the filtered spectral signal, e.g., as discussed in reference to block 702 of FIG. 7 and block 408 of FIG. 4. A means for generated by transforming the spectral signal to a latent space to generate a transformed spectral signal, a means for removing from the transformed spectral signal latent variables that are associated with undesired spectral effects associated with the unknown structure, and a means for generating a reconstructed spectral signal from the transformed spectral signal after removing the latent variables to produce the filtered spectral signal may include, e.g., one or more processors 362 of the computing system 360 with dedicated hardware or implementing executable code or software instructions 366 in memory 364 of the optical metrology device 300.

In one implementation, the one or more parameters of the SOI may be determined further using a machine learning recipe for the measurement site, e.g., as discussed in reference to blocks 708 and 710 of FIG. 7. A means for determining one or more parameters of the SOI further using a machine learning recipe for the measurement site may include, e.g., one or more processors 362 of the computing system 360 with dedicated hardware or implementing executable code or software instructions 366 in memory 364 of the optical metrology device 300.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. A method for optical measurement of a sample, the method comprising:
   obtaining optical metrology data from a plurality of measurement sites on one or more samples, wherein each measurement site comprises a structure-of-interest (SOI) having a set of known parameters and an unknown structure that has unknown parameters, wherein the optical metrology data comprises spectral signals;
   extracting spectral variations correlated with key parameters associated with the SOI from the spectral signals;
   generating reconstructed spectral signals based on the spectral variations correlated with the key parameters associated with the SOI; and
   generating a physics-based model for optical measurement of the SOI based on the reconstructed spectral signals.

2. The method of claim 1, wherein the unknown structure resides at a region that underlies the SOI, is on top of the SOI, is beside the SOI, or is coincident with the SOI.

3. The method of claim 1, wherein the optical metrology data comprises at least one of ellipsometric data, reflectometric data, interferometric data, Fourier-Transform Infrared Spectroscopy (FTIR) data, or a combination thereof.

4. The method of claim 1, wherein extracting spectral variations correlated with the key parameters associated with the SOI from the spectral signals comprises transforming the spectral signals to a latent space and identifying spectral variations correlated with the key parameters in the latent space.

5. The method of claim 4, wherein transforming the spectral signals to the latent space is based on at least one of Partial Least Squares (PLS), Orthogonal PLS (OPLS), PLS Canonical, Canonical Correlation Analysis (CCA), Principal Component Analysis (PCA), or Independent Component Analysis (ICA), Kernel Partial Least Squares (KPLS), Kernel Principal Component Analysis (KPCA), Non-Linear (Variational) Autoencoder.

6. The method of claim 4, further comprising:
   removing latent variables that are irrelevant to the key parameters associated with the SOI;
   wherein generating the reconstructed spectral signals based on the spectral variations correlated with the key parameters associated with the SOI uses retained latent variables that are relevant to the key parameters associated with the SOI.

7. The method of claim 4, further comprising:
   extracting latent variables to create an extracted latent variables that are relevant to undesired spectra variation; and
   constructing a spectra delta using the extracted latent variables that are relevant to undesired spectra variation;
   wherein generating the reconstructed spectral signals based on the spectral variations correlated with the key parameters associated with the SOI uses the spectral signals and the spectra delta.

8. The method of claim 1, wherein the physics-based model comprises at least one of an optical critical dimension (OCD) model, a time resolved acoustic model, and an x-ray critical dimension model.

9. The method of claim 1, wherein the physics-based model comprises a rigorous model that represents the SOI and an effective model that represents the unknown structure.

10. The method of claim 1, further comprising generating a machine learning model for optical measurement for the SOI.

11. The method of claim 10, wherein the machine learning model comprises a machine learning recipe.

12. An optical metrology device configured for optical measurement of a sample, the optical metrology device comprising:
    a light source configured to generate light to be incident on measurement sites on samples, each measurement site comprising a structure-of-interest (SOI) having a set of known parameters and an unknown structure that has unknown parameters;
    a detector configured to detect light from the measurement sites produced in response to the light that is incident on a target structure; and
    at least one processor coupled to the detector, wherein the at least one processor is configured to:
      obtain optical metrology data from a plurality of measurement sites on one or more samples, wherein the optical metrology data comprises spectral signals;
      extract spectral variations correlated with key parameters associated with the SOI from the spectral signals;
      generate reconstructed spectral signals based on the spectral variations correlated with the key parameters associated with the SOI; and
      generate a physics-based model for optical measurement of the SOI based on the reconstructed spectral signals.

13. The optical metrology device of claim 12, wherein the unknown structure resides at a region that underlies the SOI, is on top of the SOI, is beside the SOI, or is coincident with the SOI.

14. The optical metrology device of claim 12, wherein the optical metrology data comprises at least one of ellipsometric data, reflectometric data, interferometric data, Fourier-Transform Infrared Spectroscopy (FTIR) data, or a combination thereof.

15. The optical metrology device of claim 12, wherein the at least one processor is configured to extract spectral variations correlated with the key parameters associated with the SOI from the spectral signals by being configured to transform the spectral signals to a latent space and identifying spectral variations correlated with the key parameters in the latent space.

16. The optical metrology device of claim 15, wherein the at least one processor is configured to transform the spectral signals to the latent space based on at least one of Partial Least Squares (PLS), Orthogonal PLS (OPLS), PLS Canonical, Canonical Correlation Analysis (CCA), Principal Component Analysis (PCA), or Independent Component Analysis (ICA), Kernel Partial Least Squares (KPLS), Kernel Principal Component Analysis (KPCA), Non-Linear (Variational) Autoencoder.

17. The optical metrology device of claim 15, wherein the at least one processor is further configured to:
    remove latent variables that are irrelevant to the key parameters associated with the SOI;
    wherein the at least one processor is configured to generate the reconstructed spectral signals based on the spectral variations correlated with the key parameters associated with the SOI using retained latent variables that are relevant to the key parameters associated with the SOI.

18. The optical metrology device of claim 15, wherein the at least one processor is further configured to:
    extract latent variables to create extracted latent variables that are relevant to undesired spectra variation; and
    construct a spectra delta using the extracted latent variables that are relevant to undesired spectra variation;
    wherein the at least one processor is configured to generate the reconstructed spectral signals based on the spectral variations correlated with the key parameters associated with the SOI using the spectral signals and the spectra delta.

19. The optical metrology device of claim 12, wherein the physics-based model comprises at least one of an optical critical dimension (OCD) model, a time resolved acoustic model, and an x-ray critical dimension model.

20. The optical metrology device of claim 12, wherein the physics-based model comprises a rigorous model that represents the SOI and an effective model that represents the unknown structure.

21. The optical metrology device of claim 12, further comprising generating a machine learning model for optical measurement for the SOI.

22. The optical metrology device of claim 21, wherein the machine learning model comprises a machine learning recipe.

23. An optical metrology device configured for optical measurement of a sample, the optical metrology device comprising:
    a light source configured to generate light to be incident on measurement sites on samples, each measurement site comprising a structure-of-interest (SOI) having a set of known parameters and an unknown structure that has unknown parameters;
    a detector configured to detect light from the measurement sites produced in response to the light that is incident on a target structure;
    a means for obtaining optical metrology data from a plurality of measurement sites on one or more samples, wherein the optical metrology data comprises spectral signals;
    a means for extracting spectral variations correlated with key parameters associated with the SOI from the spectral signals;
    a means for generating a reconstructed spectral signal based on the spectral variations correlated with the key parameters associated with the SOI; and
    a means for generating a physics-based model for optical measurement of the SOI based on the reconstructed spectral signal.

24. A method for optical measurement of a sample, the method comprising:
    obtaining optical metrology data from a measurement site on a sample, the measurement site comprises a structure-of-interest (SOI) having a set of known parameters and an unknown structure that has unknown parameters, wherein the optical metrology data comprises a spectral signal;
    generating a filtered spectral signal to remove spectral effects from the unknown structure that has unknown parameters; and
    determining one or more parameters of the SOI using the filtered spectral signal and a model for the measurement site, wherein the model comprises a rigorous model that represents the SOI and an effective model that represents the unknown structure.

25. The method of claim 24, wherein the unknown structure resides at a region that underlies the SOI, is on top of the SOI, is beside the SOI, or is coincident with the SOI.

26. The method of claim 24, wherein the optical metrology data comprises at least one of ellipsometric data, reflectometric data, interferometric data, Fourier-Transform Infrared Spectroscopy (FTIR) data, or a combination thereof.

27. The method of claim 24, wherein generating the filtered spectral signal is based on at least one of Partial Least Squares (PLS), Orthogonal PLS (OPLS), PLS Canonical, Canonical Correlation Analysis (CCA), Principal Component Analysis (PCA), or Independent Component Analysis (ICA), Kernel Partial Least Squares (KPLS), Kernel Principal Component Analysis (KPCA), Non-Linear (Variational) Autoencoder.

28. The method of claim 24, wherein generating the filtered spectral signal comprises:
    transforming the spectral signal to a latent space to generate a transformed spectral signal;
    removing latent variables from the transformed spectral signal to create removed latent variables, the removed latent variables are associated with undesired spectral effects associated with the unknown structure; and
    generating a reconstructed spectral signal from the transformed spectral signal after removing latent variables to produce the filtered spectral signal.

29. The method of claim 24, wherein determining the one or more parameters of the SOI further uses a machine learning recipe for the measurement site.

30. An optical metrology device configured for optical measurement of a sample, the optical metrology device comprising:
    a light source configured to generate light to be incident on a measurement site on a sample, the measurement site comprising a structure-of-interest (SOI) having a set of known parameters and an unknown structure that has unknown parameters;
    a detector configured to detect light from the measurement site produced in response to the light that is incident on a target structure; and
    at least one processor coupled to the detector, wherein the at least one processor is configured to:
        obtain optical metrology data from the measurement site on the sample, wherein the optical metrology data comprises a spectral signal;
        generate a filtered spectral signal to remove spectral effects from the unknown structure that has unknown parameters; and determine one or more parameters of the SOI using the filtered spectral signal and a model for the measurement site, wherein the model comprises a rigorous model that represents the SOI and an effective model that represents the unknown structure.

31. The optical metrology device of claim 30, wherein the unknown structure resides at a region that underlies the SOI, is on top of the SOI, is beside the SOI, or is coincident with the SOI.

32. The optical metrology device of claim 30, wherein the optical metrology data comprises at least one of ellipsometric data, reflectometric data, interferometric data, Fourier-Transform Infrared Spectroscopy (FTIR) data, or a combination thereof.

33. The optical metrology device of claim 30, wherein the at least one processor is configured to generate the filtered spectral signal based on at least one of Partial Least Squares (PLS), Orthogonal PLS (OPLS), PLS Canonical, Canonical Correlation Analysis (CCA), Principal Component Analysis (PCA), or Independent Component Analysis (ICA), Kernel Partial Least Squares (KPLS), Kernel Principal Component Analysis (KPCA), Non-Linear (Variational) Autoencoder.

34. The optical metrology device of claim 30, wherein the at least one processor is configured to generate the filtered spectral signal by being configured to:
   transform the spectral signal to a latent space to generate a transformed spectral signal;
   remove latent variables from the transformed spectral signal to create removed latent variables, the removed latent variables are associated with undesired spectral effects associated with the unknown structure; and
   generate a reconstructed spectral signal from the transformed spectral signal after removing the latent variables to produce the filtered spectral signal.

35. The optical metrology device of claim 30, wherein the at least one processor is configured to determine the one or more parameters of the SOI further using a machine learning recipe for the measurement site.

36. An optical metrology device configured for optical measurement of a sample, the optical metrology device comprising:
   a light source configured to generate light to be incident on a measurement site on a sample, the measurement site comprising a structure-of-interest (SOI) having a set of known parameters and an unknown structure that has unknown parameters;
   a detector configured to detect light from the measurement site produced in response to the light that is incident on a target structure;
   means for obtaining optical metrology data from the measurement site on the sample, wherein the optical metrology data comprises a spectral signal;
   means for generating a filtered spectral signal to remove spectral effects from the unknown structure that has unknown parameters; and
   means for determining one or more parameters of the SOI using the filtered spectral signal and a model for the measurement site, wherein the model comprises a rigorous model that represents the SOI and an effective model that represents the unknown structure.

37. The optical metrology device of claim 36, wherein the means for generating the filtered spectral signal comprises:
   means for transforming the spectral signal to a latent space to generate a transformed spectral signal;
   means for removing latent variables from the transformed spectral signal to create removed latent variables, the removed latent variables are associated with undesired spectral effects associated with the unknown structure; and
   means for generating a reconstructed spectral signal from the transformed spectral signal after removing latent variables to produce the filtered spectral signal.

38. The optical metrology device of claim 23, wherein the means for extracting spectral variations correlated with the key parameters associated with the SOI from the spectral signals transforms the spectral signals to a latent space and identifying spectral variations correlated with the key parameters in the latent space.

39. The optical metrology device of claim 38, further comprising:
   means for removing latent variables that are irrelevant to the key parameters associated with the SOI;
   wherein the means for generating the reconstructed spectral signals based on the spectral variations correlated with the key parameters associated with the SOI uses retained latent variables that are relevant to the key parameters associated with the SOI.

40. The optical metrology device of claim 38, further comprising:
   means for extracting latent variables to create an extracted latent variables that are relevant to undesired spectra variation; and
   means for constructing a spectra delta using the extracted latent variables that are relevant to undesired spectra variation;
   wherein the means for generating the reconstructed spectral signals based on the spectral variations correlated with the key parameters associated with the SOI uses the spectral signals and the spectra delta.

* * * * *

UNITED STATES PATENT AND TRADEMARK OFFICE
CERTIFICATE OF CORRECTION

PATENT NO. : 12,259,338 B2
APPLICATION NO. : 17/860978
DATED : March 25, 2025
INVENTOR(S) : Petar Žuvela et al.

Page 1 of 1

It is certified that error appears in the above-identified patent and that said Letters Patent is hereby corrected as shown below:

In the Specification

Column no 13 Line no 17-18, "X-space weights Wortho®, and orthogonal X-scores Tortho" to read as "X-space weights $W_{ortho}$, and orthogonal X-scores $T_{ortho}$"

Signed and Sealed this
Twenty-ninth Day of April, 2025

Coke Morgan Stewart
*Acting Director of the United States Patent and Trademark Office*